(12) United States Patent
Kim et al.

(10) Patent No.: US 7,741,635 B2
(45) Date of Patent: Jun. 22, 2010

(54) COMPOSITION FOR ORGANIC POLYMER GATE INSULATING LAYER AND ORGANIC THIN FILM TRANSISTOR USING THE SAME

(75) Inventors: Seong Hyun Kim, Daejeon (KR); Sang Chul Lim, Daejeon (KR); Gi Heon Kim, Daejeon (KR); Ji Ho Youk, Seoul (KR); Tae Gon Kim, Incheon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 149 days.

(21) Appl. No.: 12/182,577

(22) Filed: Jul. 30, 2008

(65) Prior Publication Data

US 2009/0152537 A1 Jun. 18, 2009

(30) Foreign Application Priority Data

Dec. 17, 2007 (KR) ...................... 10-2007-0132734

(51) Int. Cl.
*H01L 35/24* (2006.01)
*H01L 51/00* (2006.01)
(52) U.S. Cl. .......... 257/40; 257/E51.007; 257/E51.027; 257/E51.028; 257/E51.036
(58) Field of Classification Search ................... 257/40, 257/E51.007, E51.027, E51.028, E51.036
See application file for complete search history.

(56) References Cited

U.S. PATENT DOCUMENTS

| | | | |
|---|---|---|---|
| 6,812,509 B2 * | 11/2004 | Xu ............................. | 257/295 |
| 7,029,945 B2 * | 4/2006 | Veres et al. .................... | 438/99 |
| 7,081,640 B2 * | 7/2006 | Uchida et al. .................. | 257/40 |
| 7,638,793 B2 * | 12/2009 | Chua et al. ..................... | 257/40 |
| 2006/0110847 A1 * | 5/2006 | Fujimori et al. ............... | 438/99 |
| 2007/0278478 A1 * | 12/2007 | Zaumseil et al. .............. | 257/40 |
| 2007/0281575 A1 * | 12/2007 | Takeshita et al. .............. | 445/58 |

FOREIGN PATENT DOCUMENTS

| | | |
|---|---|---|
| KR | 10-2006-0027102 | 3/2006 |
| KR | 10-2006-0027103 | 3/2006 |
| KR | 10-2006-0033391 | 4/2006 |
| KR | 2006-0049490 | 5/2006 |

* cited by examiner

*Primary Examiner*—Ida M Soward
(74) *Attorney, Agent, or Firm*—Rabin & Berdo, P.C.

(57) ABSTRACT

Provided are a composition for an organic polymer gate insulating layer and an Organic Thin Film Transistor (OTFT) using the same. The composition includes an insulating organic polymer including at least one selected from the group consisting of polymethylmethacrylate (PMMA), polyvinylalcohol (PVA), polyvinylpyrrolidone (PVP), poly(vinyl phenol) (PVPh) and a copolymer thereof, a crosslinking monomer having two or more double bonds, and a photoinitiator. The OTFT includes a gate insulating layer of a semi-interpenetrating polymer network formed of the composition. The composition for a photoreactive organic polymer gate insulating layer has a photochemical characteristic that enables micropatterning, and can be formed into a layer having excellent chemical resistance, thermal resistance, surface characteristics and electrical characteristics.

11 Claims, 3 Drawing Sheets

(x 200)

COMPOSITION FOR ORGANIC POLYMER GATE INSULATING LAYER AND ORGANIC THIN FILM TRANSISTOR USING THE SAME

CROSS-REFERENCE TO RELATED APPLICATION

This application claims priority to and the benefit of Korean Patent Application No. 2007-132734, filed Dec. 17, 2007, the disclosure of which is incorporated herein by reference in its entirety.

BACKGROUND

1. Field of the Invention

The present invention relates to a composition for an organic polymer gate insulating layer and an Organic Thin Film Transistor (OTFT) using the same, and more particularly, to a composition for a photoreactive organic polymer gate insulating layer that can be micropatterned and an OTFT using the composition.

2. Discussion of Related Art

Due to the abundance of methods for synthesizing their materials, the ease with which they are formed and processed, their flexibility, low production cost, and so on, OTFTs made of organic material are being vigorously researched for use in various new electronic and optical devices.

OTFTs are expected to be frequently used in actuation devices of plastic-based active Organic Light Emitting Devices (OLEDs), smartcards, and plastic chips for inventory tags, and thus are currently being researched in the foremost companies, research institutes, universities, and so on. OTFT performance is evaluated in terms of field effect mobility, an on/off ratio, mobility, a subthreshold slope, and so on. In addition, OTFT performance is influenced by the degree of crystallization of an organic active layer, an electric charge characteristic of an interface between an organic insulating layer and the organic active layer, a thin film characteristic of the organic insulating layer, a carrier injection capability of an interface between source and drain electrodes and the organic active layer, and so on. To improve these characteristics, various methods are being tried out.

As a gate insulating layer of an OTFT, a material having low electrical conductivity and a high breakdown field is required. Currently, silicon oxide layers are used as gate insulating layers of OTFTs. When an inorganic insulating layer is applied to an OTFT, physical/chemical characteristics of a substrate (particularly, plastic substrates) and other layers, i.e., previously-processed layers formed on the substrate in previous processes, are affected by high temperature required to form the inorganic insulating layer, and characteristics of the OTFT may deteriorate. Therefore, research is underway into a new organic gate insulating layer that can be formed through a low-temperature process and thus minimize deterioration of previously-processed layers.

Currently, polyimide (Korean Patent Publication No. 2003-0016981), polyvinylalcohol (PVA) (Korean Patent Publication No. 2002-0084427), poly(vinyl phenol-maleimide) (Korean Patent Publication No. 2004-0028010), photoacryl, etc., are used for organic insulating layers, but do not have as good device characteristics as an inorganic insulating layer. Therefore, in order to implement a highly efficient OTFT, an organic gate insulating layer which can be formed thin through a simplified process without affecting a substrate and previously-processed layers, as well as a material for an organic active layer, must be developed.

While conducting research on an organic polymer gate insulating layer for efficiently implementing OTFTs, the present inventors uncovered the following facts upon which the present invention is based. When a composition obtained by dissolving a polymer having excellent insulation characteristics, such as polymethylmethacrylate (PMMA), PVA, polyvinylpyrrolidone (PVP), poly(vinyl phenol) (PVPh) or a copolymer thereof, a crosslinking monomer having two or more double bonds, a photoinitiator, and a thermoinitiator, in an appropriate solvent, is used as a material for gate insulating layer, it is possible to form a thin film comprising a semi-interpenetrating polymer network that can be micropatterned and improve electrical characteristics. Furthermore, when the thin film is used in an OTFT, it is possible to improve device characteristics.

SUMMARY OF THE INVENTION

The present invention is directed to providing a composition for an organic polymer gate insulating layer which has photocrosslinking characteristics capable of micropatterning, and can improve electrical characteristics.

The present invention is also directed to providing an Organic Thin Film Transistor (OTFT) including the organic polymer gate insulating layer to improve device characteristics.

One aspect of the present invention provides a composition for an organic polymer gate insulating layer, including: an insulating organic polymer including at least one selected from the group consisting of polymethylmethacrylate (PMMA), polyvinylalcohol (PVA), polyvinylpyrrolidone (PVP), poly(vinyl phenol) (PVPh) and a copolymer thereof; a crosslinking monomer having two or more double bonds; and a photoinitiator.

Another aspect of the present invention provides an OTFT, including: an organic polymer gate insulating layer formed by dissolving a composition for an organic polymer gate insulating layer in a solvent. Here, the composition for an organic polymer gate insulating layer includes: an insulating organic polymer including at least one selected from the group consisting of PMMA, PVA, PVP, PVPh and a copolymer thereof; a crosslinking monomer having two or more double bonds; and a photoinitiator.

BRIEF DESCRIPTION OF THE DRAWINGS

The above and other objects, features and advantages of the present invention will become more apparent to those of ordinary skill in the art by describing in detail exemplary embodiments thereof with reference to the attached drawings, in which.

DETAILED DESCRIPTION OF EXEMPLARY EMBODIMENTS

Figure 1:
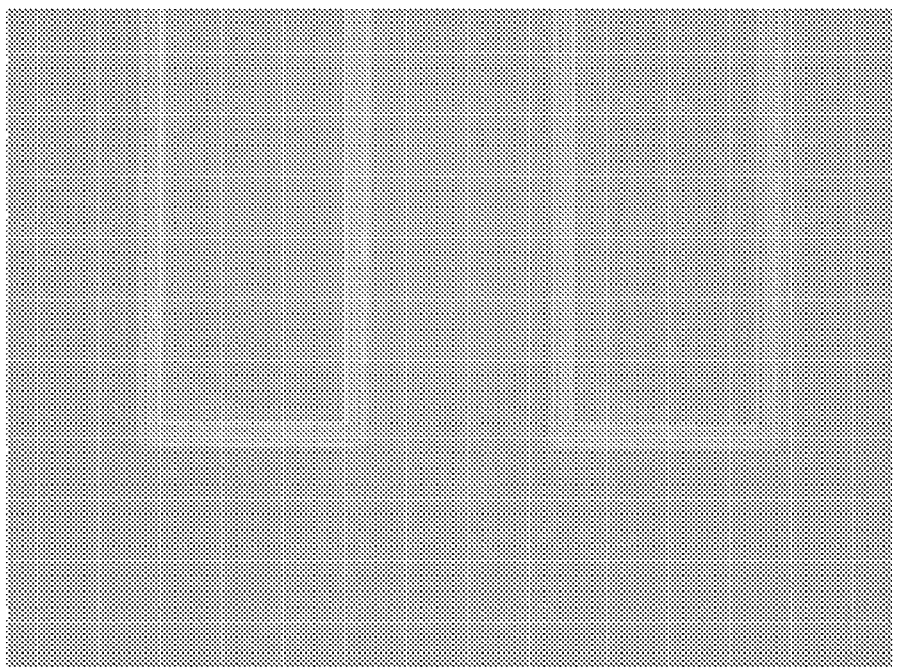
FIG. 1 shows an image of a Polymethylmethacrylate (PMMA)-based organic polymer gate insulating layer patterned by lithography according to an exemplary embodiment of the present invention.

According to an exemplary embodiment of the present invention, a composition for a photoreactive polymer gate insulating layer including an insulating organic polymer, a crosslinking monomer having two or more double bonds, and a photoinitiator, is provided.

The insulating organic polymer may be one or more selected from polymethylmethacrylate (PMMA), polyvinylalcohol (PVA), polyvinylpyrrolidone (PVP), poly(vinyl phenol) (PVPh) shown in chemical formulae 1 to 4 below, and a copolymer thereof.

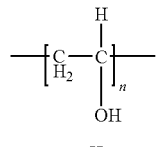

[Chemical Formula 1]

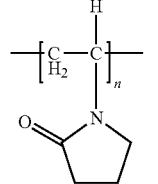

[Chemical Formula 2]

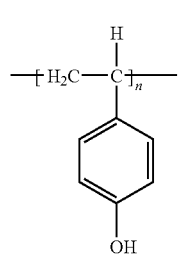

[Chemical Formula 3]

[Chemical Formula 4]

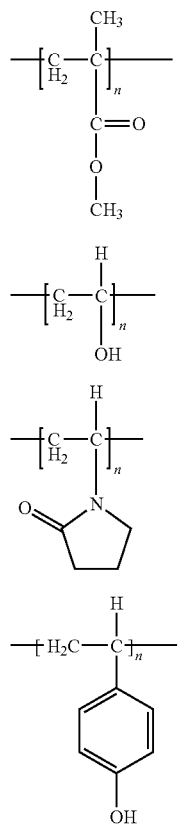

In the above formulae, the degree of polymerization of the polymers may be determined according to their intended use. The degree of polymerization of the polymers is at least 50 and may be 100 to 1000.

The copolymers include, but is not limited to, poly(methylmethacrylate-random-vinyl alcohol), poly(methylmethacrylate-random-vinyl pyrrolidone), poly(methylmethacrylate-random-vinyl phenol), poly(vinyl alcohol-random-vinyl pyrrolidone), or poly(vinyl pyrrolidone-random-vinyl phenol). The copolymerization ratio of the copolymers can be 1/99 to 99/1.

The insulating organic polymer may be present in an amount of 1 or more weight %, and preferably from 5 to 50 weight %, based on the total composition weight.

The crosslinking monomer having two or more double bonds may be selected from those shown in chemical formulae 5 to 8 below.

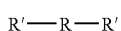

[Chemical Formula 5]

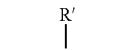

[Chemical Formula 6]

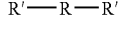

[Chemical Formula 7]

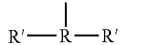

[Chemical Formula 8]

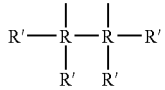

In the above formulae,

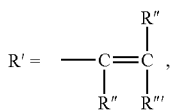

and R" is —H, —CH$_3$, —CH$_2$CH$_3$, etc.

As the crosslinking monomer having two or more double bonds, pentaerythritol tetraacrylate or dipentaerythritol hexaacrylate shown in chemical formulae 9 and 10 below may be better.

[Chemical Formula 9]

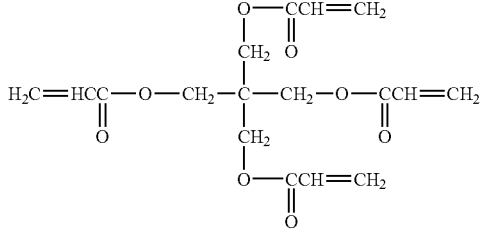

[Chemical Formula 10]

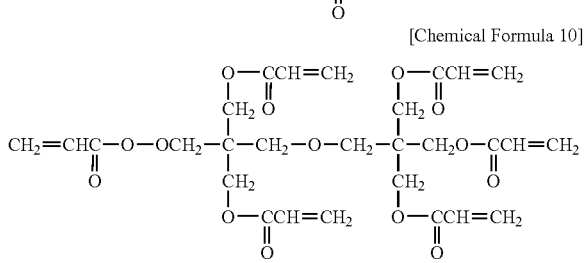

The crosslinking monomer may be present in an amount of 1 or more weight %, and preferably from 5 to 50 weight %, based on the total composition weight.

When the crosslinking monomer of 1 or more weight % based on the total composition weight is included, it is possible to form a gate insulating layer of a semi-interpenetrating polymer network that can be micropatterned and has excellent chemical resistance and thermal resistance.

The photoinitiator of 0.1 or more weight % based on the total composition weight must be added to cause a photoreaction, and the photoinitiator may be preferably added in range of 0.25 to 3.5 weight %.

When the crosslinking monomer and the photoinitiator corresponding to specific weight percentages are included in the composition for a gate insulating layer, the other material may be an insulating organic polymer.

In the composition for a gate insulating layer, a thermoinitiator may be further included. The thermoinitiator must be added in an amount of 0.1 or more weight parts based on 100 weight % of the composition weight, and the thermoinitiator may be added in range of 0.25 to 3.5 weight parts.

The insulating organic polymer, the crosslinking monomer, the photoinitiator and the thermoinitiator may be dissolved in a solvent, e.g., propylene glycol monomethyl ether acetate or ethyl-3-ethoxypropionate, at a concentration of 1 or more weight %, and used. As the solvent, an organic solvent generally used in this field may be used. The concentration of the polymer must be 1 or more weight % to ensure a coating characteristic and the thickness of a thin film.

The insulating organic polymer may be used as a homopolymer in a gate insulating layer, or may be physically blended with another homopolymer having an excellent insulation characteristic and used in consideration of physical, chemical and electrical characteristics of an organic insulating layer.

The composition for a photoreactive organic polymer gate insulating layer according to an exemplary embodiment of the present invention has a photochemical characteristic enabling micropatterning. And, using a thermoinitiator, additional crosslinks of double bonds remaining after patterning enable leakage current to be reduced and electrical characteristics to be improved.

The quantity of the photoinitiator and the thermoinitiator may be appropriately determined according to a purpose, a use, elements and a quantity of the composition.

The photoinitiator is activated by rays of visible wavelength, and may be selected from the following materials:
2,6-bis(4-azidobenzylidene)cyclohexanone;
2-6-bis(4-azidobenzylidene)-4-methylcyclohexanone;
4,4-diazidostilbene-2,2'-disulfonic acid disodium salt;
Ammonium dichromate;
1-hydroxy-cyclohexyl-pentyl-ketone (Irgacure 907);
2-methyl-1[4-(methylthio)phenyl]-2-morpholinopropan-1-one (Irgacure 184C);
2-hydroxy-2-methyl-1-phenyl-propan-1-one (Darocur 1173);
Mixed initiator (Irgacure 500) including 50 weight % of Irgacure 184C and 50 weight % of benzophenone;
Mixed initiator (Irgacure 1000) including 20 weight % of Irgacure 184C and 80 weight % of Darocur 1173;
2-hydroxy-1-[4-(2-hydroxyethoxy)phenyl]-2-methyl-1-propanone (Irgacure 2959);
Methylbenzoylformate (Darocur MBF);
Alpha, alpha-dimethoxy-alpha-phenylacetophenone (Irgacure 651);
2-benzyl-2-(dimethylamino)-1-[4-(4-morpholinyl)phenyl]-1-butanone (Irgacure 369);
Mixed initiator (Irgacure 1300) including 30 weight % of Irgacure 369 and 70 weight % of Irgacure 651;
Diphenyl(2,4,6-trimethylbenzoyl)-phosphine oxide (Darocur TPO);
Mixed initiator (Darocur 4265) including 50 weight % of Darocur TPO and 50 weight % of Darocur 1173;
Phosphine oxide;
Phenyl bis(2,4,6-trimethyl benzoyl) (Irgacure 819);
Mixed initiator (Irgacure 2005) including 5 weight % of Irgacure 819 and 95 weight % of Darocur 1173;
Mixed initiator (Irgacure 2010) including 10 weight % of Irgacure 819 and 90 weight % of Darocur 1173; and
Mixed initiator (Irgacure 2020) including 20 weight % of Irgacure 819 and 80 weight % of Darocur 1173.
Bis(etha5-2,4-cyclopentadien-1-yl)-bis[2,6-difluoro-3-(1H-pyrrol-1-yl)phenyl]titanium (Irgacure 784);
Mixed initiator containing benzophenone (HSP 188); and
Derivatives thereof.

The thermoinitiator is activated by heat. The thermoinitiator may be selected from the following materials and, in particular, may be a high-temperature radical initiator generating a radical in second baking:
Benzoyl peroxide (BP);
Acetyl peroxide (AP);
Diauryl peroxide (DP);
Di-tert-butyl peroxide (t-BTP);
Cumyl hydroperoxide (CHP);
Hydrogen peroxide (HP);
Potassium peroxide (PP);
2,2'-Azobisiobutyronitrile (AIBN);
Azocompound initiator; and
Silver alkyls.

An Organic Thin Film Transistor (OTFT) has a structure in which a substrate, a gate electrode, a gate insulating layer, an organic active layer and source and drain electrodes are stacked in sequence, or a substrate, a gate electrode, a gate insulating layer, source and drain electrodes and an organic active layer are stacked in sequence. The structure is not limited to these, and the OTFT may have other structures also.

The substrate is one that is generally used in this field. For example, glass, silicon wafer, plastic, etc., may be used for the substrate, but the material of the substrate is not limited to these.

In addition, the gate electrode is formed on the substrate by a method generally used in this field, e.g., an e-beam technique, using a shadow mask. For the gate electrode, a metal generally used in this field may be used. To be specific, the metal may include Au, Ah, Ni, Indium-Tin-Oxide (ITO), Al, Ti, TiN and Cr, but is not limited to these.

On the gate electrode, the gate insulating layer is formed through photocrosslinking and thermal crosslinking of a composition obtained by dissolving PMMA, PVA, PVP, PVPh or a copolymer thereof, a crosslinking monomer having two or more double bonds, a photoinitiator and a thermoinitiator in an appropriate solvent.

Figure 3A:
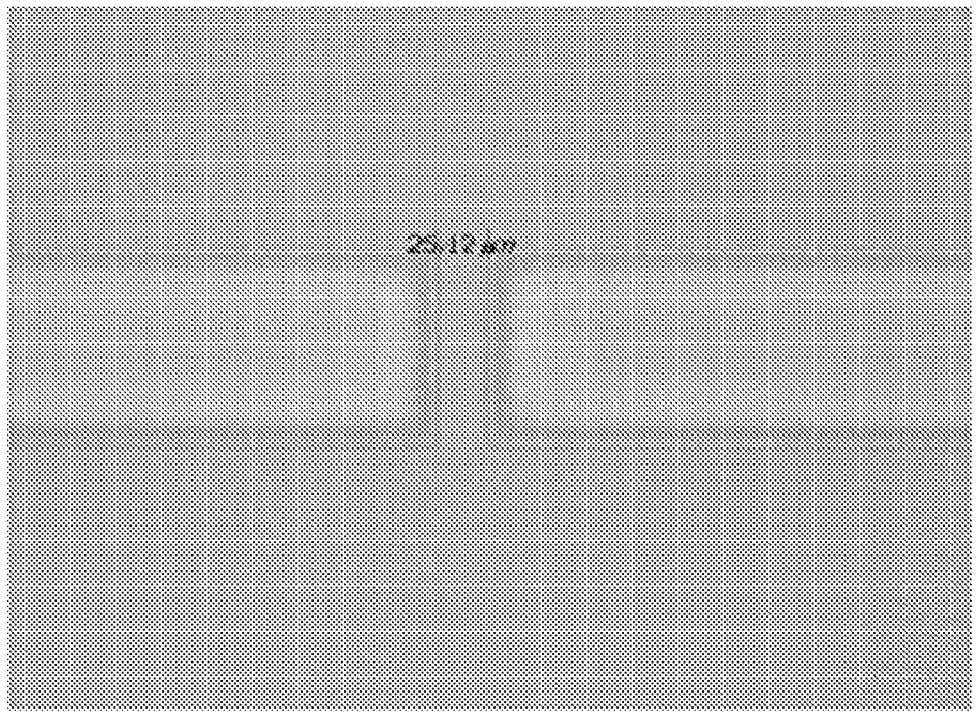
FIG. 3 shows an image of a PMMA copolymer-based organic polymer gate insulating layer patterned by lithography according to another exemplary embodiment of the present invention.
Figure 3B:
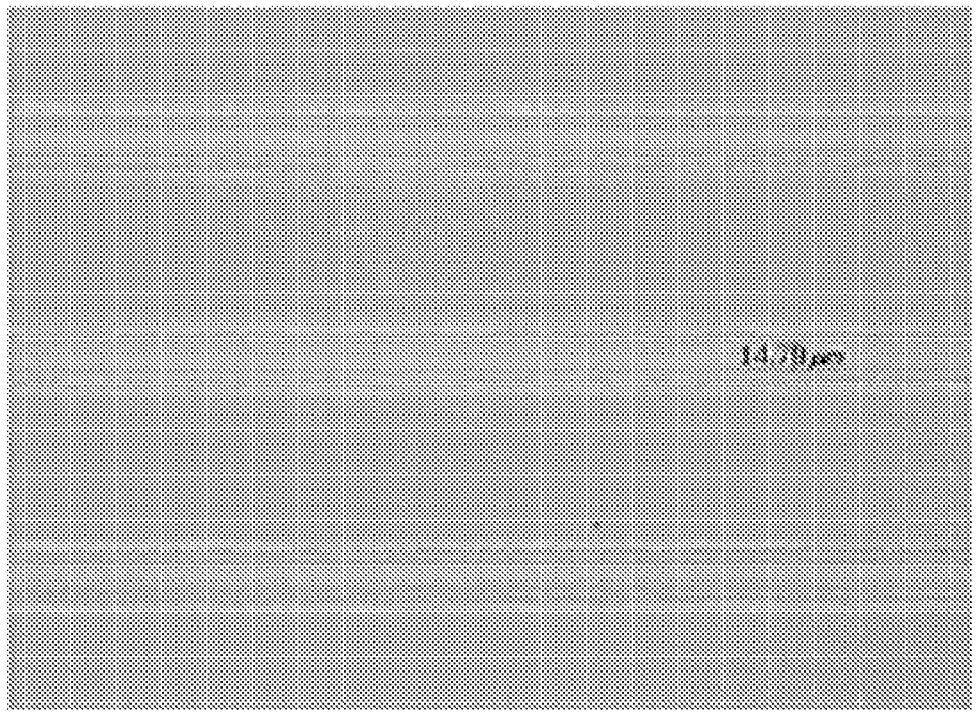

The photoreactive organic polymer gate insulating layer is formed on the gate electrode through a wet process. To be specific, the composition for a gate insulating layer is coated through spin coating, dipping or printing, baked to form the insulating layer. In addition, the organic polymer gate insulating layer is patterned through a development process after forming a semi-interpenetrating polymer network by crosslinking. Images of crosslinking organic polymer gate insulating layers patterned by lithography are shown in FIGS. 1 and 3.

On the gate insulating layer, the organic active layer may be formed of a general material, such as pentacene, dihexyl-hexythiophene (DH6T), regioregular poly(3-hexylthiophene) (P3HT), poly-9,9-dioctylfluorene-co-bithiophene (F8T2), and dihexylanthra-dithiophene (DHADT), or a derivative thereof. However, the material forming the organic active layer is not limited to these.

The organic active layer may be formed under conditions generally known in this field, by the same method as used to deposit the materials.

In addition, the source and drain electrodes may be formed of a general metal, such as Au, ITO, Al and Cr, but the material is not limited to these.

The source and drain electrodes are formed on the organic active layer by a method generally known in this field, which may be the e-beam technique using a shadow mask.

The substrate, the gate electrode, the gate insulating layer, the organic active layer and the source and drain electrodes may be formed to respective thicknesses generally used in this field.

Hereinafter, exemplary embodiments of the present invention will be described in detail. However, the present invention is not limited to the embodiments disclosed below, but can be implemented in various forms. The following embodiments are described in order to enable those of ordinary skill in the art to embody and practice the present invention.

Exemplary Embodiment 1

Preparation of Composition for a Photoreactive Organic Polymer Gate Insulating Layer PMMA as a high-permittivity organic polymer, dipentaerythritol hexaacrylate as a crosslinking monomer, and trimethylbenzen diphenyl phosphine oxide as a photoinitiator, corresponding to a weight ratio of 1.0/1.0/0.2, were dissolved in propylene glycol monomethyl ether acetate at a concentration of 25 weight % to prepare the composition for an organic polymer gate insulating layer.

Fabrication of an OTFT

First, a gate electrode of Ti(50 Å)/Au(80 Å) was formed on a p-type silicon wafer by the e-beam technique using a shadow mask. Then, the above-prepared composition for a photoreactive organic polymer gate insulating layer was spin-coated on the gate electrode at 3000 rpm, baked for two minutes at 90° C., and then photocrosslinked by infrared irradiation (wavelength=365 nm, 350 W) for two minutes. A gate insulating layer formed by actual photocrosslinking comprises a semi-interpenetrating polymer network. The formed thin film was developed using ethyl acetate, and thereby a polymer gate insulating layer having a fine film was formed. Then, the polymer gate insulating layer was baked at 200° C. for 10 minutes. The thickness of the final organic polymer gate insulating layer was 15500 Å. Subsequently, pentacene was deposited to a thickness of 800 Å under conditions of high vacuum (<1.0×10$^{-6}$ torr), a substrate temperature of 70° C., and a deposition rate of 1 Å/sec, and thereby a pentacene active layer was formed. On the pentacene active layer, Au was deposited to have a channel width of 2 mm, a channel length of 50 μm, and a thickness of 500 Å as source and drain electrodes.

Experimental Embodiment

Analysis of a Fine Pattern

FIG. 1 shows an example of a fine pattern formed by photocrosslinking the composition for a photoreactive organic polymer gate insulating layer made in Exemplary embodiment 1.

Analysis of OTFT Device Characteristics

Figure 2:
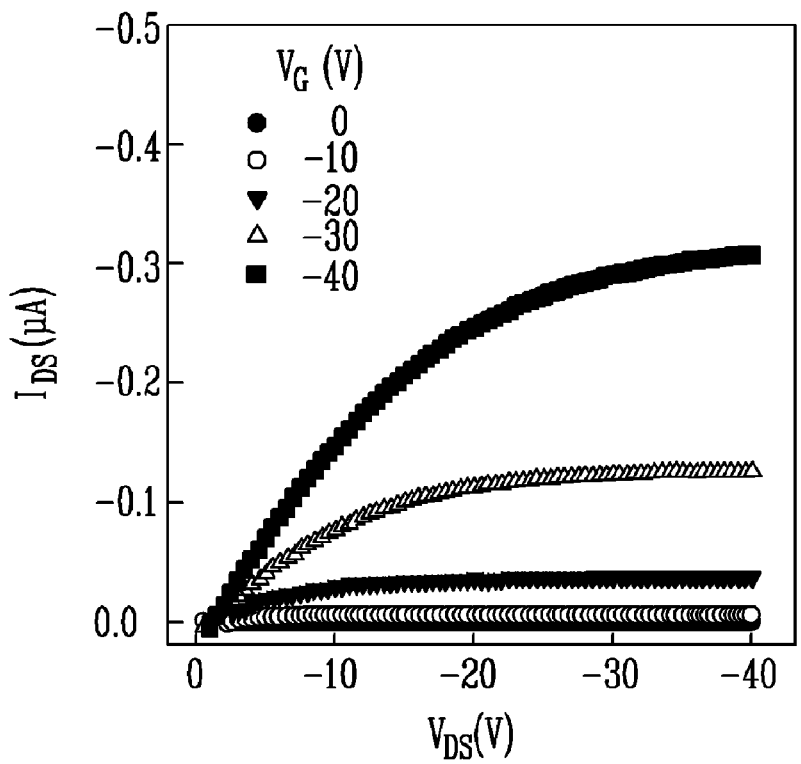
FIG. 2 shows current-voltage (I-V) curves illustrating field-effect mobility of an Organic Thin Film Transistor (OTFT) according to an exemplary embodiment of the present invention.
Figure 2:
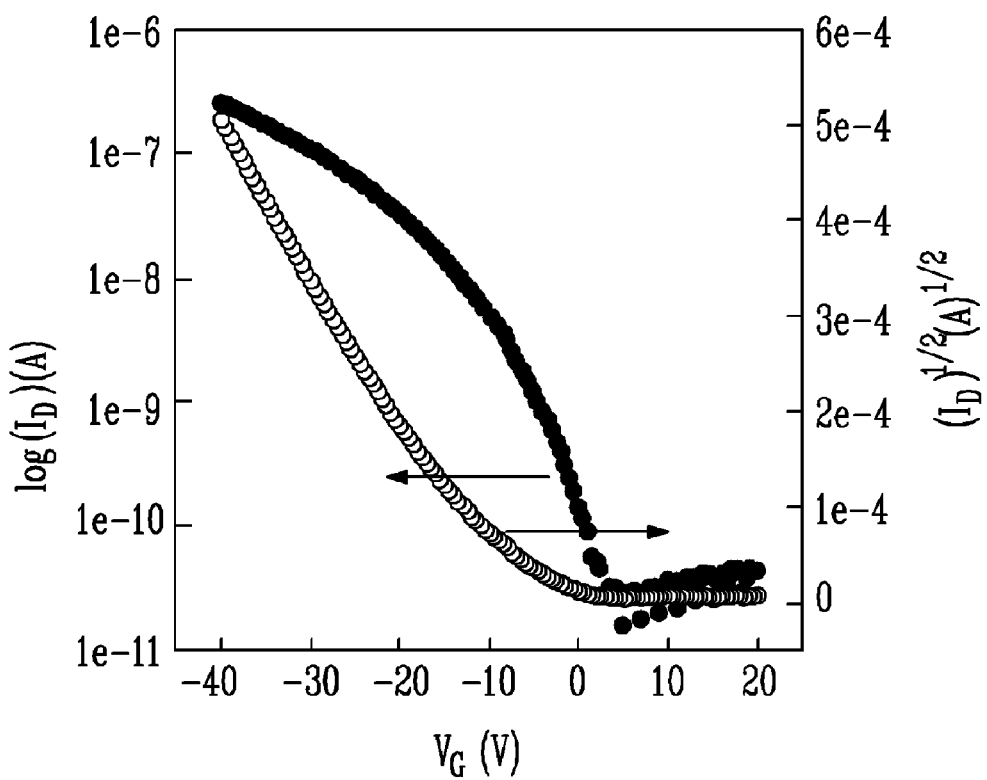

Using a semiconductor parameter analyzer (HP 4156C, Agilent) of Hewlett Packard company, the field-effect mobility of the device fabricated in Exemplary embodiment 1 was measured and is shown in FIG. 2. The characteristic graphs of FIG. 2 illustrate drain current-drain voltage (ID-VD) characteristics of a typical transistor. The field-effect mobility was calculated by Formula 1 below for the current of a saturation region on the basis of the measured current transfer characteristic curve.

$$IDS=(WCi/2\ L)\mu\ (VGS-VT)^2 \quad\quad\quad \text{[Formula 1]}$$

Here, W and L denote the width and length of source and drain electrodes, and μ, Ci and VT denote a degree of field-effect mobility, a capacitance of an insulator and a threshold voltage.

The field-effect mobility determined in this experimental embodiment was calculated by setting the dielectric constant (∈r=3.1) of PMMA to be 0.71 cm$^2$/Vs.

Exemplary Embodiment 2

Preparation of a Composition for a Photoreactive Organic Polymer Gate Insulating Layer PMMA as a high-permittivity organic polymer, pentaerythritol tetraacrylate as a crosslinking monomer, trimethylbenzen diphenyl phosphine oxide as a photoinitiator, and dicumyl peroxide as a thermoinitiator, corresponding to a weight ratio of 1.0/1.0/0.1/0.2, were dissolved in propylene glycol monomethyl ether acetate at a concentration of 25 weight % to prepare a composition for an organic polymer gate insulating layer.

Fabrication of an OTFT

An OTFT was fabricated in the same way as in Exemplary embodiment 1. The thickness of the final organic polymer gate insulating layer was 4000 Å.

Analysis of OTFT Device Characteristics

The fabricated device had the ID-VD characteristics of a typical transistor, and the field-effect mobility of this exemplary embodiment was determined to be 0.28 cm$^2$/Vs.

Exemplary Embodiments 3 to 6

Preparation of a Composition for a Photoreactive Organic Polymer Gate Insulating Layer Examples of a composition for a photoreactive organic polymer gate electrode were formed using poly(methylmethacrylate-random-vinyl phenol) (50 moles/50 moles) or poly(methylmethacrylate-random-vinyl pyrrolidone) (50 moles/50 moles) instead of the PMMA of Exemplary embodiment 1 (see Table 1 below). Poly(methylmethacrylate-random-vinyl phenol) or poly(methylmethacrylate-random-vinyl pyrrolidone) as a high-permittivity organic polymer, pentaerythritol triacrylate or dipentaerythritol hexaacrylate as a crosslinking monomer, and trimethylbenzen diphenyl phosphine oxide as a photoinitiator, corresponding to a weight ratio of 1.0/1.0/0.2, were dissolved in propylene glycol monomethyl ether acetate to prepare a composition for an organic polymer gate insulating layer.

Fabrication of an OTFT

An OTFT was fabricated in the same way as in Exemplary embodiment 1. The thickness of an organic polymer gate insulating layer is shown in Table 1.

Analysis of OTFT Device Characteristics

The thickness of the final organic polymer gate insulating layer and a field-effect mobility determined in these exemplary embodiments are shown in Table 1.

TABLE 1

| Gate Insulating Layer | Organic Polymer | Crosslinking Monomer | Concentration of Composition (wt %) | Thickness of Gate Insulating Layer (Å) | Field-Effect Mobility (cm$^2$/Vs) |
|---|---|---|---|---|---|
| Exemplary Embodiment 3 | Poly(methylmethacrylate-random-vinyl phenol) | Pentaerythritol triacrylate | 31 | 4800 | 0.23 |
| Exemplary Embodiment 4 | Poly(methylmethacrylate-random-vinyl phenol) | Dipentaerythritol hexaacrylate | 31 | 6000 | 0.35 |
| Exemplary Embodiment 5 | Poly(methylmethacrylate-random-vinyl pyrrolidone) | Pentaerythritol triacrylate | 25 | 8200 | 0.65 |
| Exemplary Embodiment 6 | Poly(methylmethacrylate-random-vinyl pyrrolidone) | Dipentaerythritol hexaacrylate | 25 | 6500 | 0.81 |

The composition for a photoreactive organic polymer gate insulating layer and the OTFT using the same according to exemplary embodiments of the present invention have the following effects.

First, the composition for a photoreactive organic polymer gate insulating layer according to an exemplary embodiment of the present invention constitutes a polymer layer that can be processed by photolithography.

Second, the composition for a photoreactive organic polymer gate insulating layer according to an exemplary embodiment of the present invention is micropatterned through a low-temperature photolithography process such that deterioration of a previously-processed layer is minimized.

Third, the OTFT according to an exemplary embodiment of the present invention uses a variety of previously-processed layers due to a photoreactive organic polymer gate insulating layer, such that the structure of the OTFT can be diversified.

Fourth, the composition for a photoreactive organic polymer gate insulating layer according to an exemplary embodiment of the present invention is formed through a wet process, and thus it is preferable to fabricate OTFTs on a large substrate.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A composition for an organic polymer gate insulating layer, comprising:
   an insulating organic polymer including at least one selected from the group consisting of polymethylmethacrylate (PMMA), polyvinylalcohol (PVA), polyvinylpyrrolidone (PVP), poly(vinyl phenol) (PVPh) and a copolymer thereof;
   a crosslinking monomer having two or more double bonds; and
   a photoinitiator.

2. The composition of claim 1, further comprising:
   a thermoinitiator.

3. The composition of claim 1, wherein the copolymer comprises poly(methylmethacrylate-random-vinyl alcohol), poly(methylmethacrylate-random-vinyl pyrrolidone), poly (methylmethacrylate-random-vinyl phenol), poly(vinyl alcohol-random-vinyl pyrrolidone), or poly(vinyl pyrrolidone-random-vinyl phenol).

4. The composition of claim 1, wherein the crosslinking monomer comprises pentaerythritol triacrylate or dipentaerythritol hexaacrylate.

5. The composition of claim 1, including the organic polymer corresponding to 1 or more weight % of a total composition weight, the crosslinking monomer corresponding to 1 or more weight % of the total composition weight, and the photoinitiator corresponding to 0.1 or more weight % of the total composition weight.

6. An Organic Thin Film Transistor (OTFT), comprising:
   an organic polymer gate insulating layer formed by dissolving a composition for an organic polymer gate insulating layer in a solvent,
   wherein the composition for an organic polymer gate insulating layer comprises:
   an insulating organic polymer including at least one selected from the group consisting of Polymethylmethacrylate (PMMA), polyvinylalcohol (PVA), polyvinylpyrrolidone (PVP), Poly(vinyl phenol) (PVPh) and a copolymer thereof;
   a crosslinking monomer having two or more double bonds; and
   a photoinitiator.

7. The OTFT of claim 6, wherein the solvent comprises propylene glycol monomethyl ether acetate or ethyl-3-ethoxypropionate.

8. The OTFT of claim 6, wherein the composition for a gate insulating layer is dissolved in the solvent at a concentration of 1 or more weight %.

9. The OTFT of claim 6, wherein the OTFT has a structure in which a gate electrode, a gate insulating layer, an organic active layer, and source and drain electrodes are sequentially stacked on a substrate.

10. The OTFT of claim 6, wherein the OTFT has a structure in which a gate electrode, a gate insulating layer, source and drain electrodes and an organic active layer are sequentially stacked on a substrate.

11. The OTFT of claim 6, wherein the gate insulating layer is patterned by a lithography process.

* * * * *